United States Patent
Ide (10) Patent No.: US 8,229,988 B2
(45) Date of Patent: Jul. 24, 2012

(54) SAMPLING CIRCUIT

(75) Inventor: Yuji Ide, Kyoto (JP)

(73) Assignee: Panasonic Corporation, Osaka (JP)

( * ) Notice: Subject to any disclaimer, the term of this patent is extended or adjusted under 35 U.S.C. 154(b) by 1238 days.

(21) Appl. No.: 11/994,785

(22) PCT Filed: Jul. 4, 2006

(86) PCT No.: PCT/JP2006/313338
§ 371 (c)(1),
(2), (4) Date: Jan. 4, 2008

(87) PCT Pub. No.: WO2007/004655
PCT Pub. Date: Jan. 11, 2007

(65) Prior Publication Data
US 2009/0121773 A1     May 14, 2009

(30) Foreign Application Priority Data
Jul. 5, 2005   (JP) ................ 2005-196634

(51) Int. Cl.
*G06F 7/38*     (2006.01)
(52) U.S. Cl. ....................................... 708/490
(58) Field of Classification Search .............. 708/3, 490
See application file for complete search history.

(56) References Cited

U.S. PATENT DOCUMENTS

| | | | | |
|---|---|---|---|---|
| 3,701,894 A | * | 10/1972 | Low et al. | 708/422 |
| 6,199,085 B1 | * | 3/2001 | Ihm | 708/490 |
| 2001/0035834 A1 | | 11/2001 | Variyam et al. | |

FOREIGN PATENT DOCUMENTS

| | | |
|---|---|---|
| JP | 1-156682 | 6/1989 |
| JP | 4-227118 | 8/1992 |
| JP | 6-85668 | 3/1994 |
| JP | 7-131346 | 5/1995 |
| JP | 2002-31670 | 1/2002 |

OTHER PUBLICATIONS

International Search Report issued Aug. 15, 2006 in the International (PCT) Application No. PCT/JP2006/313338.
Written Opinion of the ISA issued Aug. 15. 2006 in the international (PCT) Application No. PCT/JP2006/313338.

* cited by examiner

*Primary Examiner* — Tan V. Mai
(74) *Attorney, Agent, or Firm* — Wenderoth, Lind & Ponack, L.L.P.

(57) ABSTRACT

A sampling circuit includes a latch circuit which latches the digital signal S1 at a constant period, an addition register which adds the sampled data for the same input code, a divider which divides the added value by a predetermined divisor, a digital memory which stores the divided value and outputs it at an arbitrary timing for a predetermined reading out number, an operator which operates the output data from the digital memory in accordance with a previously set algorithm, a judgment circuit which judges the operation result with a predetermined judgment criterion, and a control logic part which controls such that the addition and outputting processing by the addition register and the division and outputting processing by the divider are carried out concurrently with the sampling processing by the latch circuit. This sampling circuit in an AD converter or a DA converter can reduce inspection cost.

12 Claims, 6 Drawing Sheets

SAMPLING CIRCUIT

TECHNICAL FIELD

The present invention relates to a sampling circuit in an AD converter or a DA converter.

BACKGROUND ART

When analyzing the waveform which is outputted from an AD converter or a DA converter, it is not possible to carry out an exact analysis if the noises included in the waveforms are removed. As sources generating noises, there are noises which are mixed into from the power supply or ground, or noises which are possessed by an LSI tester or a measuring apparatus itself.

In order to remove noises, there is a method of performing a filtering processing with using a low pass filter for analog signals while using a filter for digital signals. In these methods, however, it is required to appropriately select a low pass filter or a filter in accordance with an AD converter or a DA converter. In addition, when outputs of plural AD converters or plural DA converters are switched to be outputted to a signal line, the low pass filters or the filters also have to be provided in plural, thereby resulting in complicated circuits.

As another method for removing noises, there is a method of taking a mean of the sampled data. This method makes it possible to cancel random noises which are included in the sampled data and to obtain waveform data having high precision by taking a mean of the sampled data. Further, it is possible to eliminate or minimize the noise reduction circuit such as the above-described low pass filter or filter for reducing noises, and thereby it is advantageously possible to simplify the circuit or equipment that is required for performing an analysis, and further to enhance the reliability of the entire analysis equipment as well as to reduce the cost thereof.

This conventional noise reduction method using taking means will be described with reference to the drawings.

In the conventional method of removing noises shown in FIG. 13, the same waveform data are outputted plural times and then the sampling is performed.

Figure 13A:
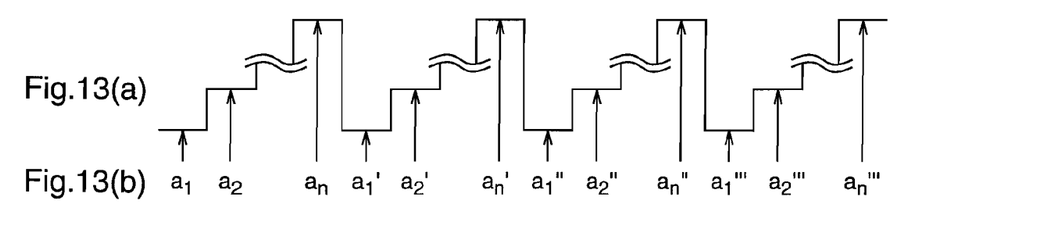
FIG. 13 is a diagram illustrating a conventional sampling method.

For example, as shown in FIG. 13($a$), digital data for four cycles are inputted to the sampling circuit, and sampling is carried out once for 1/n cycle as shown in FIG. 13($b$). Then, the sampled data are added together for the same phase sampling points, and the results are stored in a memory. That is, the addition result of data $a_1$, $a_1'$, $a_1''$, $a_1'''$ is stored in a memory as a first phase sampled data, the addition result of data $a_2$, $a_2'$, $a_2''$, $a_2'''$ is stored as a second phase sampled data, and the addition result of data $a_n$, $a_n'$, $a_n''$, $a_n'''$ is stored as an n-th phase sampled data. Then, after the sampling of digital data for four cycles are completed, taking a mean processing is carried out by software for respective sampled data corresponding to the respective input data. Thereby, a digital data that is obtained by taking a mean for four cycles is obtained.

As another method of performing noise removal employing a taking a mean processing, there is a method in which the same waveform data are inputted plural times, output data which are obtained by performing sampling at the same timings in the respective waveform data are added together to be successively stored in a memory, and after the sampling is completed, an addition mean is operated by an operator to be outputted. Thus, a part of the addition and outputting processing among the taking a mean processing is carried out while performing sampling, thereby reducing the calculation time (for example, Patent Reference 1).

Patent document 1: Japanese Published Patent Application No. Hei. 1-156682 (Page 8, FIG. 3)

DISCLOSURE OF THE INVENTION

Problems to be Solved by the Invention

However, in the conventional method of reducing noises employing taking a mean processing, when the sampling number increases, there arises an increase in the capacity required for the data memory for storing sampled data, thereby increasing the cost for the inspection equipment, and thereby further increasing the inspection cost.

In addition, since the above method requires an address generator for generating sampling point addresses when storing the sampled data in a memory, it is impossible to sufficiently suppress the circuit scale, resulting in incapability of realizing a low cost inspection equipment.

Further, since an operation processing such as taking a mean processing is required after the sampling is completed, the inspection time is lengthened due to the time required for that operation processing, and thereby, the inspection cost is also increased.

The present invention is directed to solving the above-described problems, and has for its object to provide a sampling circuit in an AD converter or a DA converter, that can reduce the inspection cost.

Measures to Solve the Problems

In order to solve the above-described problems, according to a first aspect of the preset invention, there is provided a sampling circuit which comprises a sampling means which receives digital data which is outputted from a device to be measured as an input and samples the digital data at a constant period, an addition and outputting means for adding digital data which was sampled by the sampling means for a predetermined addition number for each same input code, and successively outputting the added values; and a control means for controlling such that the addition and outputting processing by the addition and outputting means is carried out concurrently with the sampling processing by the sampling means.

Thereby, since the sampling processing by the sampling means and the addition and outputting processing by the addition and outputting means are carried out concurrently, the inspection time can be further reduced. In addition, since there is no necessity of mounting a memory having a large capacity for storing the sampled data until the sampling processing is completed, an inspection equipment having reduced the circuit scale to the necessary minimum and of a low cost is realized.

According to a second aspect of the present invention, there is provided a sampling circuit as defined in the first aspect, wherein the control means includes an addition number setting means for individually setting an addition number for the digital data which are to be added by the addition and outputting means for each same input code.

Thereby, since while inspecting such as non-linearity errors in the AD converter, it is possible to increase the sampling number for the input signals among the digital data outputted from the AD converter, which are likely to be affected by noises, thereby to enhance the noise removal precision. On the other hand, it is possible to reduce the sampling number for the input signals which are not likely to be affected by noises. Thus, by adjusting the sampling number while inspecting the device to be measured, it is possible to make both the inspection precision and inspection cost of high efficiency.

According to a third aspect of the present invention, there is provided a sampling circuit as defined in the first aspect, wherein there is provided data storing means for storing the added value which is outputted from the addition and outputting means and outputting the added value at arbitrary timings for a predetermined reading out number, the control means includes an output data number setting means for setting the reading out number for the added value which is stored in the data storing means, and the control means controls timings for storing the added values in the data storing means and timings for reading out the added values from the data storing means.

Thereby, it is possible to carry out an inspection, even if no memory for storing the sampled data which is taken a mean is provided outside the sampling circuit.

According to a fourth aspect of the present invention, there is provided a sampling circuit as defined in the first aspect, wherein the addition and outputting means comprises a single adder or plural adders each of which adds the input data for a predetermined addition number and outputs the added value, the control means includes an addition number setting means for setting an addition number for the input data which are added by the single adder or each of the plural adders, and the control means controls such that the addition and outputting processing by the single adder or each of the plural adders is carried out concurrently with the sampling processing by the sampling means.

Thereby, since it can be corresponded to even a case where the addition data amount is large, a data processing can be carried out efficiently by, for example, combining adder circuits which have a high data processing speed but have only a small data capacity and adder circuits which have a large data capacity but have a low data processing speed.

According to a fifth aspect of the present invention, there is provided a sampling circuit as defined in the third aspect wherein there is provided an operating means which operates the added values which are read out from the data storing means for each of the predetermined reading out number in accordance with an arbitrary algorithm and outputs the operation result, and the control means controls timings for the operations by the operation means and timings for outputting the operation result.

Thereby, it is possible to carry out a predetermined inspection, even if no memory or no circuit with an operating function for storing the sampling data which is taken a mean, is provided outside the sampling circuit. In addition, in a case where an operating means is provided outside the sampling circuit, and the operating means in the sampling circuit is capable of performing a higher speed operation processing than the operation means outside, the operation time can be shortened by employing the operating means in the sampling circuit with priority, and thereby, the inspection time can be also shortened.

According to a sixth aspect of the present invention, there is provided a sampling circuit as defined in the fifth aspect, wherein there is provided a judging means for judging the operation result that is outputted from the operation means with a predetermined criterion and outputting the judgment result, and the control means controls timings for performing judgment by the judging means and timings for outputting the judgment result.

Thereby, since it is possible to carry out a series of operation comprising sampling the input signal, performing operation, and performing judgment in the sampling circuit, it is possible to carry out an inspection of such as non-linearity errors in the AD converter even by an inspection apparatus that is not provided with a taking a mean means, an operating means, and a judging means.

According to a seventh aspect of the present invention, there is provided a sampling circuit as defined in the first aspect, wherein there is provided a digital conversion means for converting analog data that is outputted from the device to be measured into digital data and outputs the converted result to the sampling means, and the control means controls timings and dynamic ranges for the conversion by the digital conversion means.

Thereby, since it is possible to carry out a series of operation comprising sampling the input signal, performing operation, and performing judgment in the sampling circuit, it is possible to carry out an inspection of such as non-linearity errors in the AD converter even by an inspection apparatus which is not provided with a taking a mean means, an operating means, and a judging means.

According to an eighth aspect of the present invention, there is provided a sampling circuit comprising a sampling means which receives a digital data of one cycle that is outputted from the device to be measured and samples the digital data with a constant period, an addition and outputting means for adding digital data which are sampled by the sampling means for a predetermined addition number for each same input code and successively outputting the added values, a division and outputting means for dividing each of added values which are outputted from the addition and outputting means by a predetermined divisor and outputting the divide value, and the control means controls such that the addition and outputting processing by the addition and outputting means and the division and outputting processing by the division and outputting means are carried out concurrently with the sampling processing by the sampling means.

Thereby, since it is not required to carry out the sampling of the digital data in plural cycles, the inspection time can be reduced. In addition, since it is possible to carry out the sampling processing by the sampling means, the addition and outputting processing by the addition and outputting means, and the division and outputting processing by the division and outputting means concurrently with each other, it is possible to further reduce the inspection time. Further, since it is not necessary to mount a memory of large capacity for storing sampled data up until the sampling is completed, it is possible to realize an inspection equipment having reduced the circuit scale to the necessary minimum and of a low cost is realized.

According to a ninth aspect of the present invention, there is provided a sampling circuit as defined in the eighth aspect wherein the control means includes an addition number setting means for setting the addition number of digital data which is added for the same input code by the addition and outputting means individually for each input code, and a divisor setting means for setting the divisor on the basis of the addition number which is set by the addition number setting means individually for each input data.

Thereby, since while inspecting the non-linearity errors in the AD converter, it is possible to increase the sampling number for the input signals among the digital data outputted from the AD converter, which are likely to be affected by noises, thereby to enhance the noise removal precision. On the other hand, it is possible to reduce the sampling number for the input signals which are not likely to be affected by noises. Thus, by adjusting the sampling time number while inspecting the device to be measured, it is possible to make both the inspection precision and inspection cost of high efficiency.

According to a tenth aspect of the present invention, there is provided a sampling circuit as defined in the eighth aspect, wherein there is provided a data storing means which stores the divided value that is outputted from the division and outputting means and outputs the divided value for each of the predetermined reading out number at arbitrary timings, the control means has a data output number setting means for setting the reading out number for the divided value which is stored in the data storing means, and the control means controls timing for the divided value entered into the data storing means and timings for the divided value read out from the data storing means.

Thereby, it is possible to carry out a predetermined inspection, even if no memory for storing the sampling data which is taken a mean is provided outside the sampling circuit. Further, since only the result of taking a mean processing is stored in the data storing means, the memory capacity required can be reduced to a great extent.

According to an eleventh aspect of the present invention, there is provided a sampling circuit as defined in the eighth aspect, wherein the addition and outputting means comprises a single adder or plural adders each of which adds input data for a predetermined addition number and outputs the added result, the control means includes an addition number setting means for setting an addition number for the input data which are added by the single adder or each of the plural adders, and a divisor number setting means for individually setting the divisor for each input data on the basis of the addition number that is set by the addition number setting means, and the control means controls such that the addition and outputting processing by the single adder or each of the plural adders and the division and outputting processing by the division means are carried out concurrently with the sampling processing by the sampling means.

Thereby, since it can be corresponded to even a case where the addition data amount is large, a data processing can be carried out efficiently by, for example, combining adder circuits which have a high data processing speed but have only a small data capacity and adder circuits which have a large data capacity but have a low data processing speed.

According to a twelfth aspect of the present invention, there is provided a sampling circuit as defined in the tenth aspect, wherein there is provided an operating means which operates the division value that is read out from the data storing means for each of the predetermined reading out number in accordance with an arbitrary algorithm and outputs the operation result, and the control means control timings for the operations by the operation means and timings for outputting the operation result.

Thereby, it is possible to carry out a predetermined inspection, even if no memory or no circuit with an operating function for storing the sampled data which is taken a mean, is provided outside the sampling circuit. In addition, in a case where an operating means is provided outside the sampling circuit, and the operating means in the sampling circuit is capable of performing a higher speed operation processing than the operation means outside, the operation time can be shortened by employing the operating means in the sampling circuit with priority, and thereby, the inspection time can also be shortened.

According to a thirteenth aspect of the present invention, there is provided a sampling circuit as defined in the twelfth aspect wherein there is provided a judging means for judging the operation result that is outputted from the operation means with a predetermined criterion and outputting judgment result, and the control means controls timings for judgments by the judging means and timings for outputting the judgment result.

Thereby, since it is possible to carry out a series of operation comprising sampling the input signal, performing operation, and performing judgment in the sampling circuit, it is possible to carry out an inspection of such as non-linearity errors in the AD converter even by an inspection apparatus which is not provided with a taking mean means, an operation means, and a judging means.

According to a fourteenth aspect of the present invention, there is provided a sampling circuit as defined in the eighth aspect, wherein there is provided a digital conversion means which converts analog data that is outputted from the device to be measured into digital data and outputs the result to the sampling means, and the control means controls timings and dynamic ranges for the conversion by the digital conversion means.

Thereby, since it is possible to carry out a series of operation comprising sampling the input signal, performing operation, and performing judgment in the sampling circuit, it is possible to carry out an inspection of such as non-linearity errors in the AD converter even by an inspection apparatus that is not provided with a taking a mean means, an operation means, and a judging means.

Effects of the Invention

In the sampling circuit according to the present invention, since in inspecting the non-linearity errors in an AD converter or a DA converter, the sampling processing for sampling the inputted one cycle digital data at a constant period, and the addition and outputting processing for adding the sampled digital data for the same input code and successively outputting the added result are carried out concurrently with each other, the operation time can be reduced, and the inspection time can be reduced to a great extent.

In the sampling circuit according to the present invention, since the sampled data is not stored as it is for the same input code into the data storing means but the result of taking a mean operation thereof is only stored therein, a memory capacity that would be required for storing sampled data can be reduced to a great extent.

DESCRIPTION OF REFERENCE NUMERALS 10, 20, 21, 30, 40, 50, 60, 70 . . . sampling circuit
11 . . . control logic part
12 . . . latch circuit
13, 14, 23, 24 . . . addition register
15 . . . divider
16 . . . digital memory
17 . . . operator
18 . . . judgment circuit
19 . . . AD converter

BEST MODE FOR CARRYING OUT THE INVENTION

First Embodiment

Hereinafter, a sampling circuit according to a first embodiment of the present invention will be described with reference to the drawings.

Figure 1:
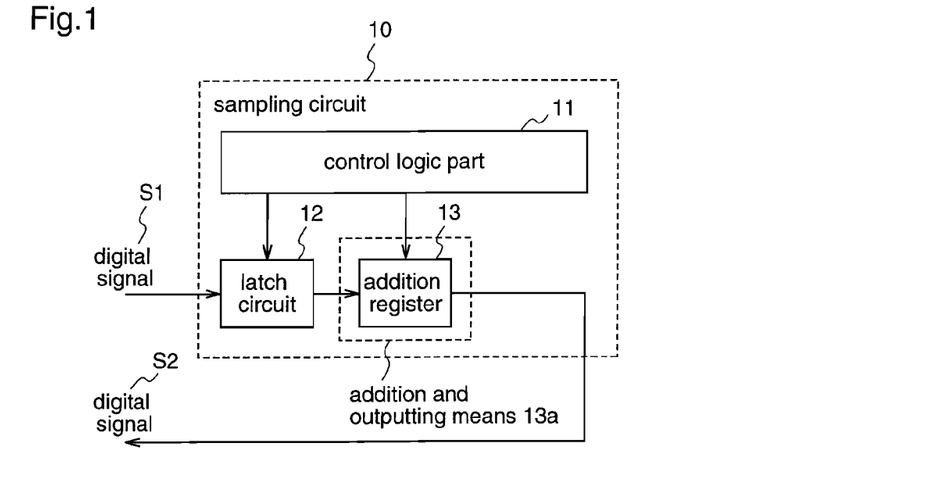
FIG. 1 is a diagram illustrating a construction of a sampling circuit in an AD converter or a DA converter according to a first embodiment of the present invention.

FIG. 1 is a diagram illustrating a construction of a sampling circuit 10 in an AD converter or a DA converter according to a first embodiment of the present invention.

The sampling circuit 10 according to this first embodiment is provided with a control logic unit (control means) 11, a latch circuit (constituting a sampling means) 12, and an addition and outputting means 13a.

The latch circuit 12 receives one cycle digital signal S1 which is outputted from the device to be measured as an input and samples the digital signal S1 at a constant period.

The addition and outputting means 13a comprises an addition resister (adder circuit), and adds the digital data which was sampled by the latch circuit 12 for a predetermined addition number for the same input code, and outputs the added values successively.

The control logic unit 11 has an addition number setting means (not shown) for setting the addition number of the digital data which are added for the same input code by the addition resister 13, and controls such that the addition and outputting processing by the addition resister 13 is carried out concurrently with the sampling processing by the latch circuit 12.

Next, an operation of the sampling circuit 10 of this first embodiment will be described.

FIG. 2 is a diagram illustrating a sampling method in the first embodiment.

Figure 2A:
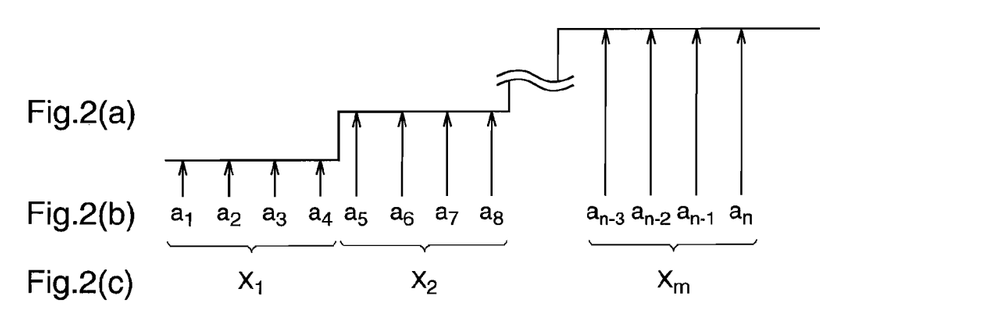
FIG. 2 is a diagram illustrating a sampling method in the first embodiment of the present invention.

As shown in FIG. 2(a), digital signal S1 for one cycle that is outputted from the device to be measured is inputted to the latch circuit 12. In the latch circuit 12, the inputted digital signal S1 is sampled at a constant period, as shown in FIG. 2(b). In FIG. 2(b), the sampled data are represented as a1, a2, a3, a4, - -, an-2, an-1, and an. Further, the sampled data a1, a2, a3, and a4 are data of the same code, the sampling data a5, a6, a7, and a8 are data of the same code, and the sampled data an-3, an-2, an-1, and an are data of the same code.

The sampled digital data are inputted to the addition register 13. In the addition register 13, digital data which are sampled by the latch circuit 12 are added for four data for the same input code, and the added values are successively outputted. In FIG. 2(c), the added values which are outputted from the addition register 13 are represented as X1, X2, - -, Xm. The relations between the sampled data a1-an and the added values X1 to Xm are as a1+a2+a3+a4=X1, a5+a6+a7+a8=X2, - -, an-3+an-2+an-1+an=Xm, respectively. These added values are the digital signal S2 which are outputted from the sampling circuit 10. That is, the entirety of the sampling circuit 10 successively outputs added values which are obtained by adding the sampled digital data for a predetermined number for each same input code.

The above-described processing is controlled by the control logic unit 11 such that the sampling processing by the latch circuit 12 and the addition and outputting processing by the addition and outputting means 13a are performed concurrently. Specifically, it is controlled such that the addition and outputting processing by the addition register 13 for four sampled data $a_1$, $a_2'$ $a_3$, $a_4$ is carried out concurrently with the next sampling processing by the latch circuit 12, i.e., the subsequent sampling processing for sampled data $a_5$, $a_6'$ $a_7$, $a_8$.

In the sampling circuit 10 of this first embodiment, a latch circuit 12 which samples the digital data S1 of one cycle which are outputted from the device to be measured at a constant period, an addition register 13 which adds sampled digital data for four data for the same input data and successively outputs the added values, and a control logic unit 11 which controls such that the addition and outputting processing by the addition register 13 is carried out concurrently with the sampling processing by the latch circuit 12 are provided. Therefore, there is no necessity of making the addition and outputting processing carried out with waiting the conclusion of the sampling processing as in the conventional method. Thereby, it is possible to reduce the inspection time to a great extent. Further, contrary to that in the conventional method, a memory of a large capacity for storing the sampled data up until the addition and outputting processing is performed is required, the sampling circuit of this first embodiment does not require mounting such a memory, thereby enabling to reduce the circuit scale to the necessary minimum, and thereby realizing an inspection equipment at a low cost.

While in the first embodiment the addition number of sampled data which are added together by the addition register 13 is made four for each same input code, the addition number may be individually set for each input code, employing addition number setting means provided in the control logic unit 11.

For example, when inspecting the non-linearity error in an AD converter, it is possible to increase the sampling number for the input signals which are likely to be affected by noises among the digital data outputted from the AD converter, and thereby increasing the population parameter for taking a mean, and further enhancing the noise removal precision. On the other hand, for the input signals which are previously known as not being likely to be affected, it is possible to perform noise removal with a sampling number that is reduced to the necessity minimum. As such, in inspecting a device to be measured, it is possible to carry out adjustment of the sampling number, thereby enabling to make the inspection precision and inspection cost of high efficiency.

Second Embodiment

Hereinafter, a sampling circuit according to a second embodiment of the present invention will be described with reference to the drawings.

Figure 3:
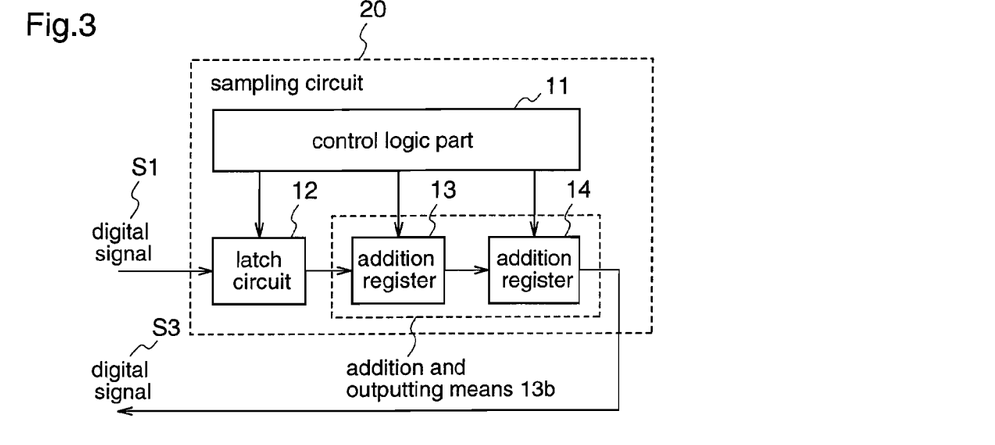
FIG. 3 is a diagram illustrating a construction of a sampling circuit in an AD converter or a DA converter according to a second embodiment of the present invention.

FIG. 3 is a diagram illustrating a construction of a sampling circuit 20 in an AD converter or a DA converter according to the second embodiment. In FIG. 3, the same reference numerals as used in FIG. 1 are added to the same constituents.

The sampling circuit of this second embodiment is provided with a control logic part 11, a latch circuit 12, and an addition and outputting means 13b.

The addition and outputting means 13b comprises two adder circuits 13 and 14, which adds the input data for a predetermined addition number, and outputs the added values, respectively.

The addition register 14 adds the addition values which are inputted from the addition register 13 for a predetermined addition number, and output the added value.

In addition, the control logic part 11 has addition number setting means for setting the respective addition numbers for the additions by the respective addition registers 13, 14, and controls such that the addition and outputting processing by the addition register 13 and the addition and outputting processing by the addition register 14 are carried out concurrently with the sampling processing by the latch circuit 12.

In this second embodiment, the first stage addition register 13 is one that has a high data processing speed while having a small data capacity, and the second stage addition register 14 is one that has a large data capacity while having a low data processing speed.

An operation of the sampling circuit 20 according to this second embodiment will be described.

FIG. 4 is a diagram illustrating a sampling method according to this second embodiment.

Figure 4A:
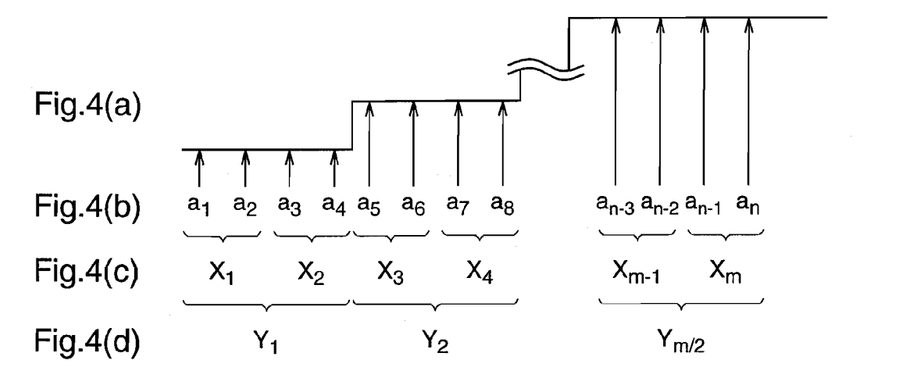
FIG. 4 is a diagram illustrating a sampling method in the second embodiment of the present invention.

As shown in FIG. 4(a), digital data for one cycle S1 that is outputted from the device to be measured is inputted to the latch circuit 12. In the latch circuit 12, the inputted digital signal S1 is sampled at a certain period, as shown in FIG. 4(b). In FIG. 4(b), the sampled digital data are represented as a1, a2, a3, a4, - -, an-2, an-1, and an. Further, the sampled data a1, a2, a3, and a4 are data of the same code, the sampled data a5, a6, a7, and a8 are data of the same code, and sampled data an-3, an-2, an-1, and an are data of the same code.

The sampled data are inputted to the addition register 13. In the addition register 13, the digital data which are sampled by the latch circuit 12 are added for two data for the same input code, and the added values are successively outputted. In FIG. 4(c), the added values which are outputted from the first stage addition register 13 are represented as X1, X2, - -, Xm. The relations between the sampled data a1-an and the added values X1-Xm are a1+a2=X1, a3+a4=X2, - -, an-3+an-2=Xm-1 and an-1+an=Xm.

The added value which is outputted from the addition register 13 is inputted to the addition register 14. In the addition register 14, the added values which are outputted from the addition register 13 are added for two data for the same input code, and the added values are successively outputted. In FIG. 4, the added values which are outputted from the second stage register 14 are represented as Y1, Y2, - -, Ym/2. The relations between the additional values X1-Xm which are outputted from the first stage addition register 13 and the added values Y1-Ym/2 which are outputted from the second stage addition register 14 are X1+X2=Y1, X3+X4=Y2, - -, Xm-1+Xm=Ym/2. The added values which are outputted from the addition register 14 serve as digital signal S3 which are outputted from the sampling circuit 20. That is, the entirety of the sampling circuit 20 successively outputs added values which are obtained by adding the sampled digital data for four data for each same input code.

The above-described processing is controlled by the control logic unit 11 such that the addition and outputting processing by the addition and outputting means 13b is carried out concurrently with the sampling processing by the latch circuit 12. Specifically, the addition and outputting processing for the sampled data $a_1$ and sampled data $a_2$ by the addition register 13, the addition and outputting processing for sampled data $a_3$ and sampled data $a_4$ by the addition register 13, and the addition and outputting processing for the added value $X_1$ and added value $X_2$ by the addition register 14 are carried out concurrently with the subsequent sampling processing for sampled data $a_5$, $a_6$, $a_7$, $a_8$ by the latch circuit 12.

In the sampling circuit 20 of this second embodiment, a latch circuit 12 which samples the digital data of one cycle S1 which are outputted from the device to be measured at a constant period, an addition register 13 which adds sampled digital data for two data for the same input code and successively outputs the added values, an addition register 14 which adds the added values which are outputted from the addition register 13 for two data for the same input code and successively outputs the added values, and a control logic unit 11 which controls such that the addition and outputting processing by the addition register 13 and the addition and outputting processing by the addition register 14 are carried out concurrently with the sampling processing by the latch circuit 12 are provided. Therefore, there is no necessity of making the addition and outputting processing carried out with waiting the conclusion of the sampling processing as in the conventional method. Thereby, it is possible to reduce the inspection time to a great extent. Further, contrary to that in the conventional method, a memory of a large capacity for storing the sampled data up until the addition and outputting processing is performed is required, the sampling circuit of this second embodiment does not require mounting such a memory, thereby enabling to reduce the circuit scale to the necessary minimum, and thereby realizing an inspection equipment at a low cost.

Further, since in this second embodiment, the first stage addition register 13 that has a high data processing speed while having a small data capacity, and the second stage addition register 14 that has a large data capacity while having a low data processing speed are combined, the data processing can be carried out efficiently, and it can be corresponded also to a case where the addition data amount is large.

While in the above second embodiment the addition number of the sampling data which are added by the addition register 13 is four for the same input code, the above-described addition number may be individually set for each input data by the addition number setting means in the control logic unit 11 and the divisor number may be individually set for each input data on the basis of the respective addition numbers which are set by the addition number setting means by the divisor number setting means. In this way, it is possible to carry out adjustment of the sampling number, thereby enabling to make the inspection precision and inspection cost of high efficiency.

Further, while in this second embodiment the addition and outputting means 13 is in a two-stage construction, this may be in a three-stage construction.

Further, while in this second embodiment, the addition and outputting means 13b comprises a serial connection of in two-stage addition registers 13 and 14, this may comprise a parallel connection of such.

Figure 11:
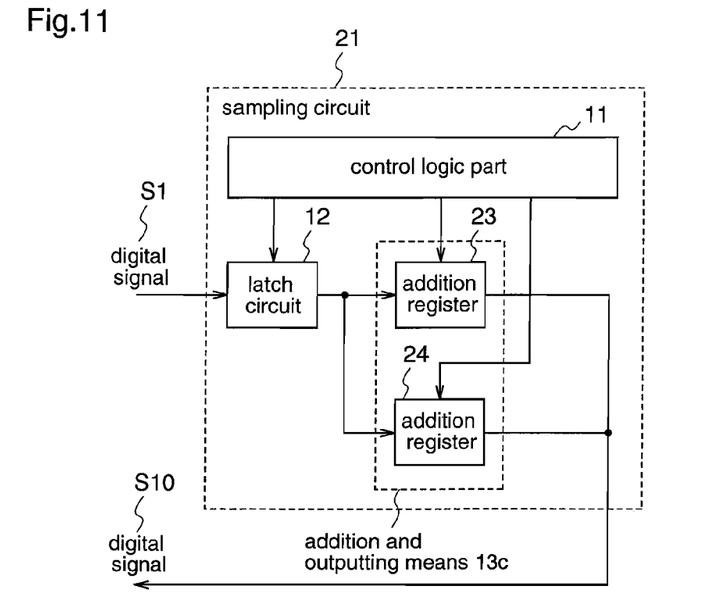
FIG. 11 is a diagram illustrating another construction of a sampling circuit in an AD converter or a DA converter according to the second embodiment of the present invention.

Here, a description is given of a sampling circuit in which the addition and outputting means is constituted by a parallel connection of in two-stage addition registers. FIG. 11 shows a sampling circuit according to another example of this second embodiment.

The sampling circuit 21 shown in FIG. 11 is provided with a control logic unit 11, a latch circuit 12, and an addition and outputting means 13c comprising in two-stage addition registers 23 and 24 which are connected in parallel with each other.

The sampling method in this sampling circuit 21 is shown in FIG. 12.

Figure 12A:
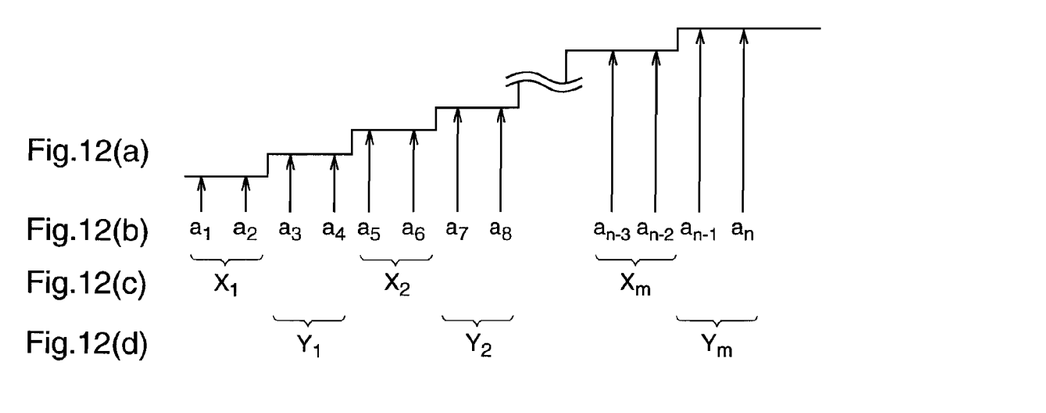
FIG. 12 is a diagram illustrating a sampling method performed in the sampling circuit of FIG. 11.

When the digital signal S1 shown in FIG. 12(a) is inputted to the sampling circuit 21, the sampling is performed by the latch circuit 12 for two data for the same input code, and the sampled data $a_1 \sim a_n$ are alternatively inputted two by two data to the addition register 23 and 24. More particularly, sampled data $a_1$, $a_2$ are inputted to the addition register 23, next sampled data $a_3$, $a_4$ are inputted to the addition register 24, next sampled data $a_5$, $a_6$ are inputted to the addition register 23, and subsequent sampled data $a_7 \sim a_n$ are similarly inputted alternatively to the respective addition registers 23 and 24, two by two data.

The sampled data which are inputted to each addition register 23, 24 for the same input code are respectively added by the respective addition registers 23 and 24 as shown in FIGS. 12(c) and 12(d), and the outputs among $X_1 \sim X_m$ from the addition register 23 and the outputs among $Y_1 \sim Y_m$ from the addition register 24 are alternatively outputted as digital signal S10.

Even in a case where the addition and outputting means is constituted by two-stage addition registers connected in parallel as such, there is no necessity of making the addition and outputting processing carried out with waiting the conclusion of the sampling processing as in the conventional method. Thereby, it is possible to reduce the inspection time to a great extent. Further, contrary to that in the conventional method, a memory of a large capacity for storing the sampled data up until the addition and outputting processing is performed is required, this sampling circuit 21 does not require mounting such a memory, thereby enabling to suppress the circuit scale to the necessary minimum, and thereby realizing an inspection equipment at a low cost.

Third Embodiment

Hereinafter, a sampling circuit according to a third embodiment of the present invention will be described with reference to the drawings.

Figure 5:
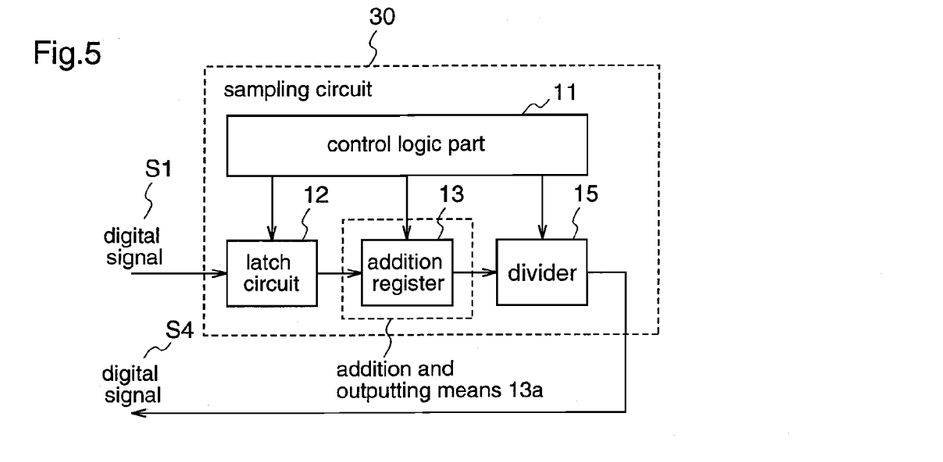
FIG. 5 is a diagram illustrating a construction of a sampling circuit in an AD converter or a DA converter according to a third embodiment of the present invention.

FIG. 5 is a diagram illustrating a construction of a sampling circuit 30 according to the third embodiment. In FIG. 5, the same reference numerals as used in FIG. 1 are added to the same constituents.

The sampling circuit 30 of this third embodiment is provided with a control logic unit 11, a latch circuit 12, an addition and outputting means 13a, and a divider (a division and outputting means) 15. In addition, the addition and outputting means 13a comprises an addition register 13.

The divider 15 divides the added values which are outputted from the addition register 13 by respective predetermined divisor and outputs the divided values.

Here, the control logic unit 11 includes an addition number setting means (not shown) for setting an addition number for the digital data which are added together by the addition register 13 for the same input code, and a divisor number setting means (not shown) for setting a divisor number that is employed for the division processing by the divider 15 on the basis of the addition number that is set by the addition number setting means, and the control logic unit 11 controls such that the addition and outputting processing by the addition register 13, and the division and outputting processing by the divider 15 are carried out concurrently with the sampling processing by the latch circuit 12.

An operation of the sampling circuit 30 according to this third embodiment will be described.

FIG. 6 is a diagram illustrating a sampling method according to this third embodiment.

Figure 6A:
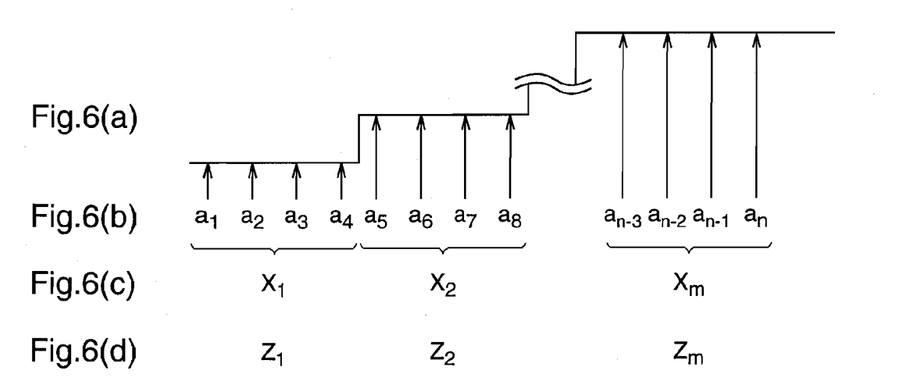
FIG. 6 is a diagram illustrating a sampling method in the third embodiment of the present invention.

As shown in FIG. 6(a), digital signal S1 for one cycle that is outputted from the device to be measured is inputted to the latch circuit 12. In the latch circuit 12, the inputted digital signal S1 is sampled at a constant period, as shown in FIG. 6(b). In FIG. 6(b), the sampled digital data are represented as a1, a2, a3, a4, - -, an-2, an-1, and an. Further, the sampled data a1, a2, a3, and a4 are data of the same code, the sampled data a5, a6, a7, and a8 are data of the same code, and sampled data an-3, an-2, an-1, and an are data of the same code.

The sampled digital data are inputted to the addition register 13. In the addition register 13, the digital data which are sampled by the latch circuit 12 are added for four data for the same input code, and the added values are successively outputted. In FIG. 6(c), the added values which are outputted from the addition register 13 are represented as X1, X2, - -, Xm. The relations between the sampled data a1~an and the added values X1~Xm are a1+a2+a3+a4=X1, a5+a6+a7+a8=X2, - -, an-3+an-2+an-1+an=Xm.

The output data from the addition register 13 is inputted to the divider 15. In the divider 15, the added value which is outputted from the addition register 13 is divided by a predetermined divisor number, i.e., "4", and the divided value is outputted. In FIG. 6(d), the divided values which are outputted from the divider 15 are represented as $Z_1, Z_2, \ldots, Z_m$. The relations between the added values $X_1 \sim X_m$ and the divided values $Z_1 \sim Z_m$ are $X_1/4=Z_1$, $X_2/4=Z_2$, ..., $X_m/4=Z_m$. These divided values which are outputted from the divider 15 are divided signals which are outputted from the sampling circuit 30. That is, the entirety of the sampling circuit 30 outputs values which are obtained by taking a mean of the sampled digital data for the same input code.

The above-described processing is controlled by the control logic unit 11 such that the sampling processing by the latch circuit 12, the addition and outputting processing by the addition and outputting means 13a, and the division and outputting processing by the divider 15 are carried out concurrently with each other. Specifically, it is controlled such that the addition and outputting processing for four sampled data $a_1$, $a_2$, $a_3$, $a_4$ by the addition register 13 and the division and outputting processing for the added value $X_1$ by the divider 15 are carried out concurrently with the subsequent sampling processing for sampled data $a_5$, $a_6$, $a_7$, $a_8$ by the latch circuit 12.

In the sampling circuit 30 of this third embodiment, a latch circuit 12 which samples the digital data of one cycle S1 which are outputted from the device to be measured at a constant period, an addition register 13 which adds sampled digital data for four data for the same input code and successively outputs the added values, a divider 15 which divides the added value that is outputted from the addition register 13 by a predetermined division number "4" and outputs the divided value, and a control logic unit 11 which controls such that the addition and outputting processing by the addition register 13 and the division and outputting processing by the divider 15 are carried out concurrently with the sampling processing by the latch circuit 12, are provided. Therefore, taking a mean processing can be carried out at the time of performing sampling. Thereby, it is possible to reduce the inspection tome to a great extent. In addition, contrary to that in the conventional method, a memory of a large capacity for storing the sampled data up until the addition and outputting processing is performed is required, the sampling circuit 30 of this third embodiment does not require mounting such a memory, thereby enabling to reduce the circuit scale to the necessary minimum, and thereby realizing an inspection equipment at a low cost.

While in the third embodiment the addition number of sampled data which are added together by the addition register 13 is four for the same input code, the addition number may be individually set for each input code by the addition number setting means provided in the control logic unit 11, and the division number may be individually set for each input code, based on the respective addition numbers which are set by the addition number setting means. In this case, it is possible to carry out adjustment of the sampling number, and thereby enabling to make the inspection precision and inspection cost of high efficiency.

Fourth Embodiment

Hereinafter, a sampling circuit according to a fourth embodiment of the present invention will be described with reference to the drawings.

Figure 7:
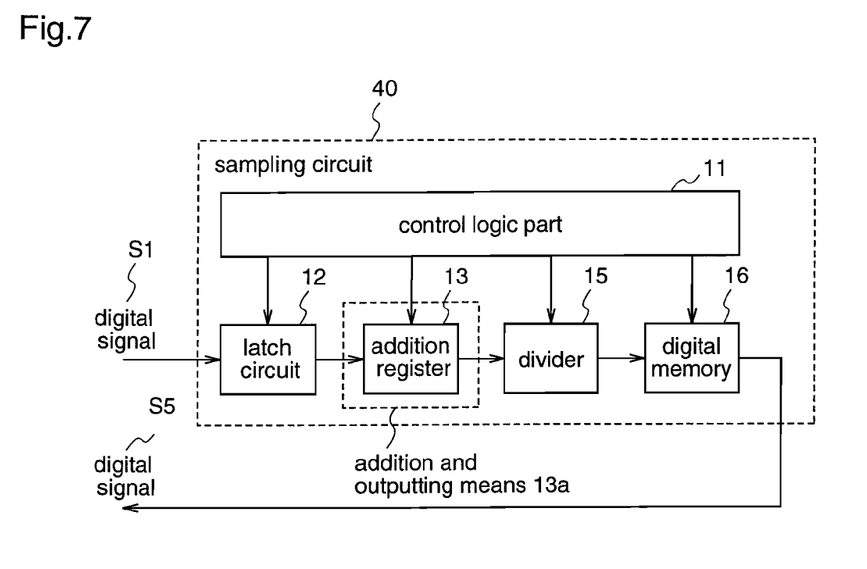
FIG. 7 is a diagram illustrating a construction of a sampling circuit in an AD converter or a DA converter according to a fourth embodiment of the present invention.

FIG. 7 is a diagram illustrating a construction of a sampling circuit 40 according to the fourth embodiment. In FIG. 7, the same reference numerals as used in FIG. 5 are added to the same constituents.

The sampling circuit 40 of this fourth embodiment is provided with a control logic unit 11, a latch circuit 12, an addition and outputting means 13a, a divider 15, and a digital memory (data storing means) 16. In addition, the addition and outputting means 13a comprises an addition register 13.

The digital memory 16 stores the divided values which are outputted from the divider 15, and outputs the divided value for each of the predetermined reading out number at arbitrary timings.

In addition, the control logic unit 11 includes an addition number setting means (not shown) for setting an addition number for the digital data which are added together by the addition register 13 for the same input code, a divisor number setting means (not shown) for setting a divisor number that is employed for the division processing by the divider 15 on the basis of the addition numbers which are set by the addition number setting means, an output number setting means (not shown) for setting a reading out number for the added values which are stored in the digital memory 16, and the control logic unit 11 controls timings for storing the divided values which are outputted from the divider 15 and timings for outputting the divided values stored from the digital memory 16.

An operation of the sampling circuit 40 of this fourth embodiment will be described. Herein, the processing from the sampling processing by the latch circuit 12 to the division and outputting processing by the divider 15 are the same as in the third embodiment.

The digital signal for one cycle S1 that is outputted from the device to be measured is inputted to the latch circuit 12. In the latch circuit 12, the inputted digital signal S1 is sampled at a constant period.

The sampled digital data are inputted to the addition register 13. In the addition register 13, the digital data which are sampled by the latch circuit 12 are added together for four data for the same input code, and the added values are outputted.

The added values which are outputted from the addition register 13 are inputted to the divider 15. In the divider 15, the inputted addition value is divided by a predetermined division number "4", and the divided value is outputted.

The above-described processing is controlled by the control logic unit 11 such that the sampling processing by the latch circuit 12, the addition and outputting processing by the addition and outputting means 13a, and the division and outputting processing by the divider 15 are carried out concurrently with each other. Specifically, it is controlled such that the addition and outputting processing for four sampled data $a_1$, $a_2$, $a_3$, $a_4$ by the addition register 13 and the division and outputting processing for the added value $X_1$ by the divider 15 are carried out concurrently with the subsequent sampling processing for four sampled data $a_5$, $a_6$, $a_7$, $a_8$ by the latch circuit 12.

The divided value which is outputted from the divider 15 is inputted to the digital memory 16. The inputted divided values are stored in the digital memory 16, and each of the stored divided values is outputted at each of the predetermined reading out number at arbitrary timings under the control by the control logic part 11. The divided values which are outputted from the digital memory 16 at each of the predetermined reading out number are the digital signal S5 which is outputted from the sampling circuit 40.

In the sampling circuit 40 of this fourth embodiment, a latch circuit 12 which samples the digital data of one cycle S1 which are outputted from the device to be measured at a constant period, an addition register 13 which adds sampled digital data for four data for the same input code and successively outputs the added values, a divider 15 which divides the added value that is outputted from the addition register 13 by a predetermined division number "4" and outputs the divided value, a digital memory 16 which stores the divided value that is outputted from the divider 15 and outputs the stored divided value at each of the predetermined reading out number, and a control logic unit 11 which controls such that the addition and outputting processing by the addition register 13 and the division and outputting processing by the divider 15 are carried out concurrently with the sampling processing by the latch circuit 12 as well as controls timings for storing digital data into the digital memory 16, timings for outputting the stored digital data, and data number to be outputted, are provided. Therefore, the processing time from the sampling processing to the division and outputting processing can be reduced, and thereby the inspection time can be reduced to a great extent. In addition, contrary to that in the conventional method, a memory of a large capacity for storing the sampled data up until the addition and outputting processing is performed is required, the sampling circuit 40 of this fourth embodiment does not require mounting such a memory, thereby enabling to reduce the circuit scale to the necessary minimum, and thereby realizing an inspection equipment at a low cost.

Further, since the sampling circuit 40 of this fourth embodiment is provided with the digital memory 16 therein, even if no memory for storing the sampling data which is taken a mean is provided outside the sampling circuit, it is possible to carry out a predetermined inspection. In addition, since only the results of having taken a mean are stored in the digital memory 16, a memory capacity that would be required can be reduced.

In addition, while in the fourth embodiment the digital data that is inputted to the digital memory 16 is digital data that is outputted from the divider 15, the digital data that is outputted from the addition register 13 may be inputted to the digital memory.

While in the fourth embodiment the addition number of sampled data which are added together by the addition register 13 is four for the same input code, the addition number may be individually set for each input code by the addition number setting means that is provided in the control logic unit 11, and the divisor number may be individually set for each input data code by the divisor number setting means, based on the respective addition numbers which are set by the addition number setting means. Then, it becomes possible to carry out adjustment of the sampling number, and thereby enabling to make the inspection precision and inspection cost of high efficiency.

Fifth Embodiment

Hereinafter, a sampling circuit according to a fifth embodiment of the present invention will be described with reference to the drawings.

Figure 8:
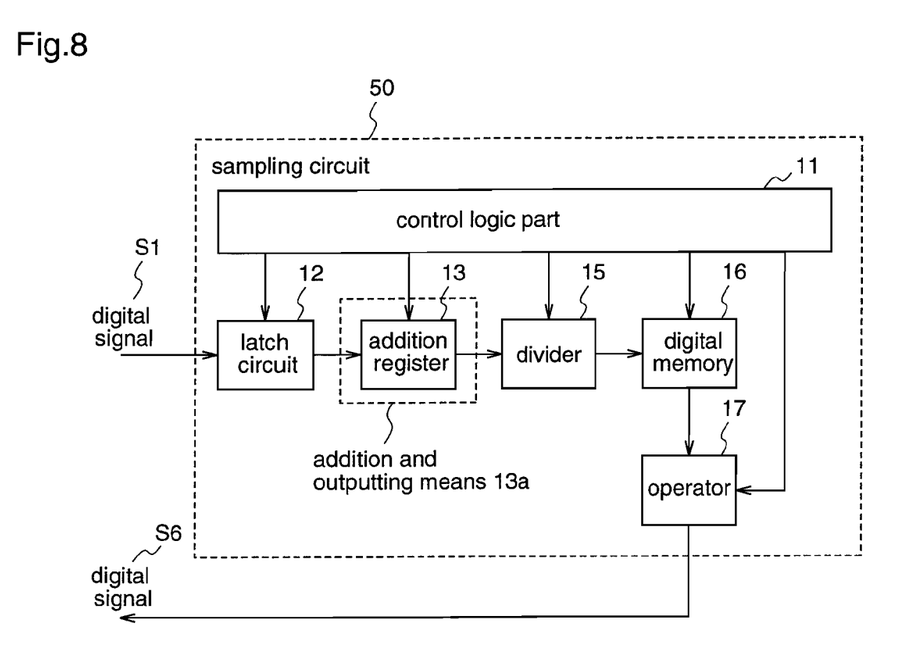
FIG. 8 is a diagram illustrating a construction of a sampling circuit in an AD converter or a DA converter according to a fifth embodiment of the present invention.

FIG. 8 is a diagram illustrating a construction of a sampling circuit 50 according to the fifth embodiment. In FIG. 8, the same reference numerals as used in FIG. 7 are added to the same constituents.

The sampling circuit 50 of this fifth embodiment is provided with a control logic unit 11, a latch circuit 12, an addition and outputting means 13a, a divider 15, a digital memory 16, and an operator (operating means) 17. In addition, the addition and outputting means 13a comprises an addition register 13.

The operator 17 receives digital data, which are outputted from the digital memory 16 for each of the predetermined reading out number, performs an operation processing such as a predetermined non-linearity error processing on the received digital data according to an arbitrary algorism that is previously set, and outputs the digital signal S6 as the operation result.

In addition, the control logic unit 11 includes an addition number setting means (not shown) for setting an addition number for the digital data which are added together by the addition register 13 for the same input code, a divisor number setting means (not shown) for setting a divisor number that is employed for the division processing by the divider 15 on the basis of the addition number that is set by the addition number setting means, a data output number setting means (not shown) for setting a reading out number for reading out digital data that is stored in the digital memory 16, and the control logic unit 11 controls timings for storing the divided values outputted from the divider 15 into the digital memory 16 and timings for outputting stored divided values from the divided memory 16.

In addition, the control logic unit 11 controls timings for the operations by the operator 17 and timings for outputting the operation result.

An operation of the sampling circuit 50 of this fifth embodiment will be described. Herein, the processing from the sampling processing by the latch circuit 12 to the division and outputting processing by the divider 15 are the same as in the third embodiment.

The digital signal for one cycle S1 that is outputted from the device to be measured is inputted to the latch circuit 12. In the latch circuit 12, the inputted digital signal S1 is sampled at a constant period.

The sampled digital data are inputted to the addition register 13. In the addition register 13, the digital data sampled by the latch circuit 12 are added together for four data for the same input code, and the added values are outputted.

The added values which are outputted from the addition register 13 are inputted to the divider 15. In the divider 15, the inputted added values are divided by a predetermined division number "4", and the divided value is outputted.

The above-described processing is controlled by the control logic unit 11 such that the sampling processing by the latch circuit 12, the addition and outputting processing by the addition and outputting means 13a, and the division and outputting processing by the divider 15 are carried out concurrently with each other. Specifically, it is controlled such that the addition and outputting processing for four sampled data $a_1$, $a_2$, $a_3$, $a_4$ by the addition register 13 and the division and outputting processing for the added value $X_1$ by the divider 15 are carried out concurrently with the subsequent sampling processing by the latch circuit 12 for four sampled data $a_5$, $a_6$, $a_7$, $a_8$.' The divided value which is outputted from the divider 15 is stored into the digital memory 16, and each of the divided values stored is outputted at each of the predetermined reading out number at arbitrary timings under the control by the control logic unit 11.

The operator 17 receives digital data, which are outputted from the digital memory 16 at each of the predetermined reading out number, performs an operation processing such as a predetermine non-linearity error processing on the received digital data, and outputs the operation result. This operation result serves as output S6 from the sampling circuit 50.

In the sampling circuit 50 of this fifth embodiment, a latch circuit 12 which samples the digital signal of one cycle S1 which are outputted from the device to be measured at a constant period, an addition register 13 which adds sampled digital data for four data for the same input code and successively outputs the added values, a divider 15 which divides the added value that is outputted from the addition register 13 by a predetermined division number "4" and outputs the divided value, a digital memory 16 which stores the divided value that is outputted from the divider 15 and outputs the divided value at each of the predetermined reading out number at arbitrary timings, an operator 17 which operates the digital data that is outputted from the digital memory 16 according to a predetermined algorism, and a control logic unit 11 which controls such that the addition and outputting processing by the addition register 13 and the division and outputting processing by the divider 15 are carried out concurrently with the sampling processing by the latch circuit 12 as well as controls timings for storing the digital data into the digital memory 16, timings for outputting the digital data from the digital memory 16, and the data number to be outputted, and further, controls timings for the operation processing by the operator 17 and timings for outputting the operation results, are provided. Therefore, the processing time from the sampling processing to the division and outputting processing can be reduced, and thereby the inspection time can be reduced to a great extent. In addition, contrary to that in the conventional method, a memory of a large capacity for storing the sampled data up until the addition and outputting processing is performed is required, the sampling circuit of this fifth embodiment does not require mounting such a memory of large data capacity, thereby enabling to reduce the circuit scale to the necessary minimum, and thereby realizing an inspection equipment at a low cost.

Further, since the sampling circuit 50 of this fifth embodiment is provided with the digital memory 16 and the operator 17 therein, even if no circuit is provided with a memory or an operation function for storing the sampling data which is taken a mean is provided outside the sampling circuit, it is possible to carry out an inspection. Further, when the operator 17 in the sampling circuit has a higher operation processing speed than the operation means provided outside the sampling circuit, the operation time can be reduced, and thereby the inspection time can also be shortened.

In addition, while in FIG. 8 the digital data that is inputted to the digital memory 16 is digital data that is outputted from the divider 15, the digital data which is outputted from the addition register 13 may be inputted to the digital memory. In that case, the operator 17 is supposed to receive the divisor number which is a number for dividing the respective digital data that is outputted from the control logic unit 11, and divides the digital data by the divisor number.

While in the fifth embodiment the addition number of sampled data which are added together by the addition register 13 is four for each same input code, the addition number may be individually set for each input code by the addition number setting means provided in the control logic unit 11, and the divisor number may be individually set for each input data code by the divisor number setting means on the basis of the respective addition numbers which are set by the addition number setting means. Then, it becomes possible to carry out adjustment of the sampling number, and thereby enabling to make the inspection precision and inspection cost of high efficiency.

Sixth Embodiment

Hereinafter, a sampling circuit according to a sixth embodiment of the present invention will be described with reference to the drawings.

Figure 9:
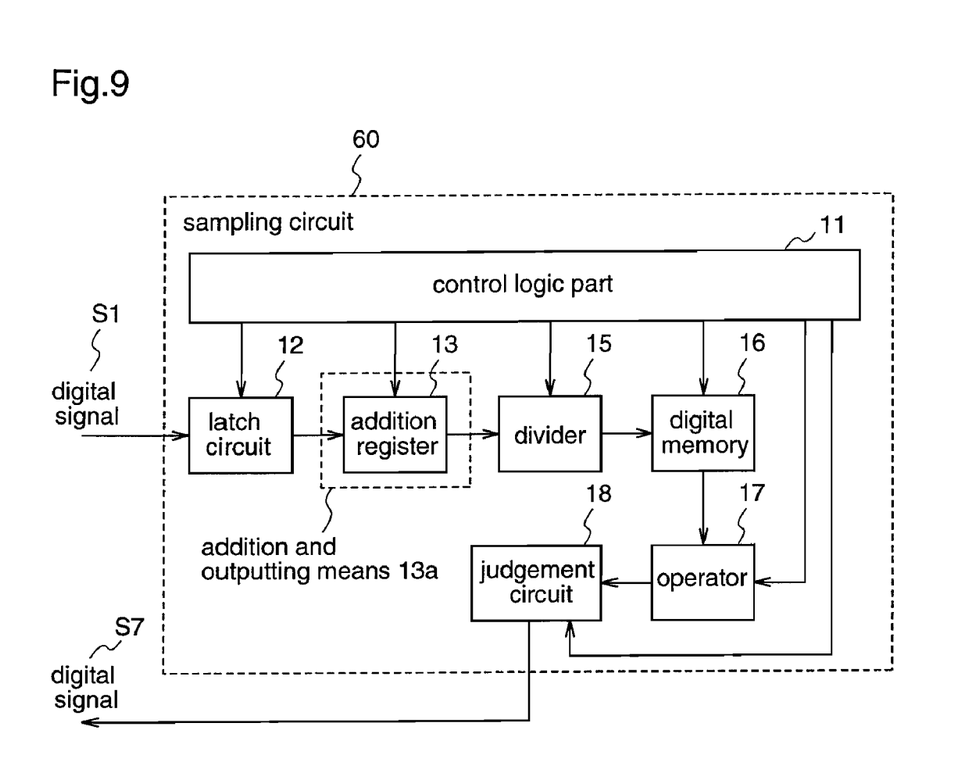
FIG. 9 is a diagram illustrating a construction of a sampling circuit in an AD converter or a DA converter according to a sixth embodiment of the present invention.

FIG. 9 is a diagram illustrating a construction of a sampling circuit 60 according to the sixth embodiment. In FIG. 9, the same reference numerals as used in FIG. 8 are added to the same constituents.

The sampling circuit 60 of this sixth embodiment is provided with a control logic unit 11, a latch circuit 12, an addition and outputting means 13a, a divider 15, a digital memory 16, an operator 17, and a judgment circuit (judgment means) 18. In addition, the addition and outputting means 13a comprises an addition register 13.

The judgment circuit 18 receives the operation result from the operator 9, and carries out judgment on the received operation results with a predetermined criterion and outputs a digital signal S7 as the judgment result.

In addition, the control logic unit 11 includes an addition number setting means (not shown) for setting an addition number for the digital data which are added together by the addition register 13 for the same input code, a divisor value setting means (not shown) for setting a divisor value that is employed for the division processing by the divider 15 on the basis of the addition numbers which are set by the addition number setting means, and a data output number setting means (not shown) for setting a reading out number for the digital data which are stored in the digital memory 16, and the control logic unit 11 is operated to control timings for storing the divided value which are outputted from the divider 15 into the digital memory 16 and timings for outputting stored divided value from the divided memory 16.

In addition, the control logic unit 11 controls timings for the operations by the operator 17 and timings for outputting the operation result.

Further, the control logic unit 11 controls timings for judgments by the judger circuit 18 and timings for outputting the judgment result.

An operation of the sampling circuit 60 of this sixth embodiment will be described. Herein, the processing from the sampling processing by the latch circuit 12 to the division and outputting processing by the divider 15 are the same as in the third embodiment.

The digital signal for one cycle S1 that is outputted from the device to be measured is inputted to the latch circuit 12. In the latch circuit 12, the inputted digital signal S1 is sampled at a constant period.

The sampled digital data are inputted to the addition register 13. In the addition register 13, the digital data sampled by the latch circuit 12 are added together for four data for the same input code, and the added values are outputted.

The added values which are outputted from the addition register 13 are inputted to the divider 15. In the divider 15, the inputted added values are divided by a predetermined division number "4", and the divided value is outputted.

The above-described processing is controlled by the control logic unit 11 such that the sampling processing by the latch circuit 12, the addition and outputting processing by the addition and outputting means 13a, and the division and outputting processing by the divider 15 are carried out concurrently with each other. Specifically, it is controlled such that the addition and outputting processing for four sampled data $a_1$, $a_2$, $a_3$, $a_4$ by the addition register 13 and the division and outputting processing for the added value $X_1$ by the divider 15 are carried out concurrently with the subsequent sampling processing for four sampled data $a_5$, $a_6$, $a_7$, $a_8$ by the latch circuit 12.

The divided value which is outputted from the divider 15 is stored in the digital memory 16, and each of the stored divided values is outputted at each of the predetermined reading out number at arbitrary timings under the control by the control logic unit 11.

The operator 17 receives digital data, which are outputted from the digital memory 16 at each of the predetermined reading out number, performs an operation processing such as a predetermined non-linearity error processing on the received digital data, and outputs the operation result.

The judgment circuit 18 receives the operation result from the operator 17, carries out judgment on the received operation result with a predetermined criterion, and outputs the judgment result. This judgment result serves as output S7 from the sampling circuit 60.

In the sampling circuit of this sixth embodiment, a latch circuit 12 which samples the digital signal S1 of one cycle that is outputted from the device to be measured at a constant period, an addition register 13 which adds the sampled digital data together four data for each same input code and successively outputs the added values, a divider 15 which divides the added value that is outputted from the addition register 13 by a predetermined division number "4" and outputs the divided value, a digital memory 16 which stores the divided value that is outputted from the divider 15 and outputs the divided value stored by for a predetermined reading out number, an operator 17 which operates the digital data that is outputted from the digital memory 16 according to a predetermined algorism, a judgment circuit 18 which judges the operation result by the operator 17 with a predetermined criterion, and a control logic unit 11 which controls such that the addition and outputting processing by the addition register 13 and the division and outputting processing by the divider 15 are carried out concurrently with the sampling processing by the latch circuit 12 as well as controls timings for storing the digital data into the digital memory 16, timings for outputting the digital data from the digital memory 16, the data number to be outputted, and further, controls timings for the operation processing by the operator 17 and timings for outputting the operation result, and further, controls timings for judgment operations by the judgment circuit and timings for outputting the judgment result, are provided. Therefore, the processing time from the sampling processing to the division and outputting processing can be reduced, and thereby the inspection time can be reduced to a great extent. In addition, contrary to that in the conventional method, a memory of a large capacity for storing the sampled data up until the addition and outputting processing is performed is required, the sampling circuit of this sixth embodiment does not require mounting such a memory of large data capacity, thereby enabling to reduce the circuit scale to the necessary minimum, and thereby realizing an inspection equipment at a low cost. Further, in this sixth embodiment, since the processing up to taking a mean processing of the sampled data, operation processing, and judgment processing can be carried out while performing sampling, an inspection such as that for non-linearity errors in an AD converter can be carried out even by an inspection apparatus that is not provided with a taking a mean means, an operation means, and a judgment means.

While in the sixth embodiment the addition number of sampled data which are added together by the addition register 13 is four for each same input code, the addition number may be individually set for each input code by the addition number setting means provided in the control logic unit 11, and the divisor number may be individually set for each input data code by the divisor number setting means on the basis of the respective addition numbers which are set by the addition number setting means. Then, it becomes possible to carry out adjustment of the sampling number, and thereby to make the inspection precision and inspection cost of high efficiency.

Seventh Embodiment

Hereafter, a sampling circuit according to a seventh embodiment of the present invention will be described with reference to the drawings.

Figure 10:
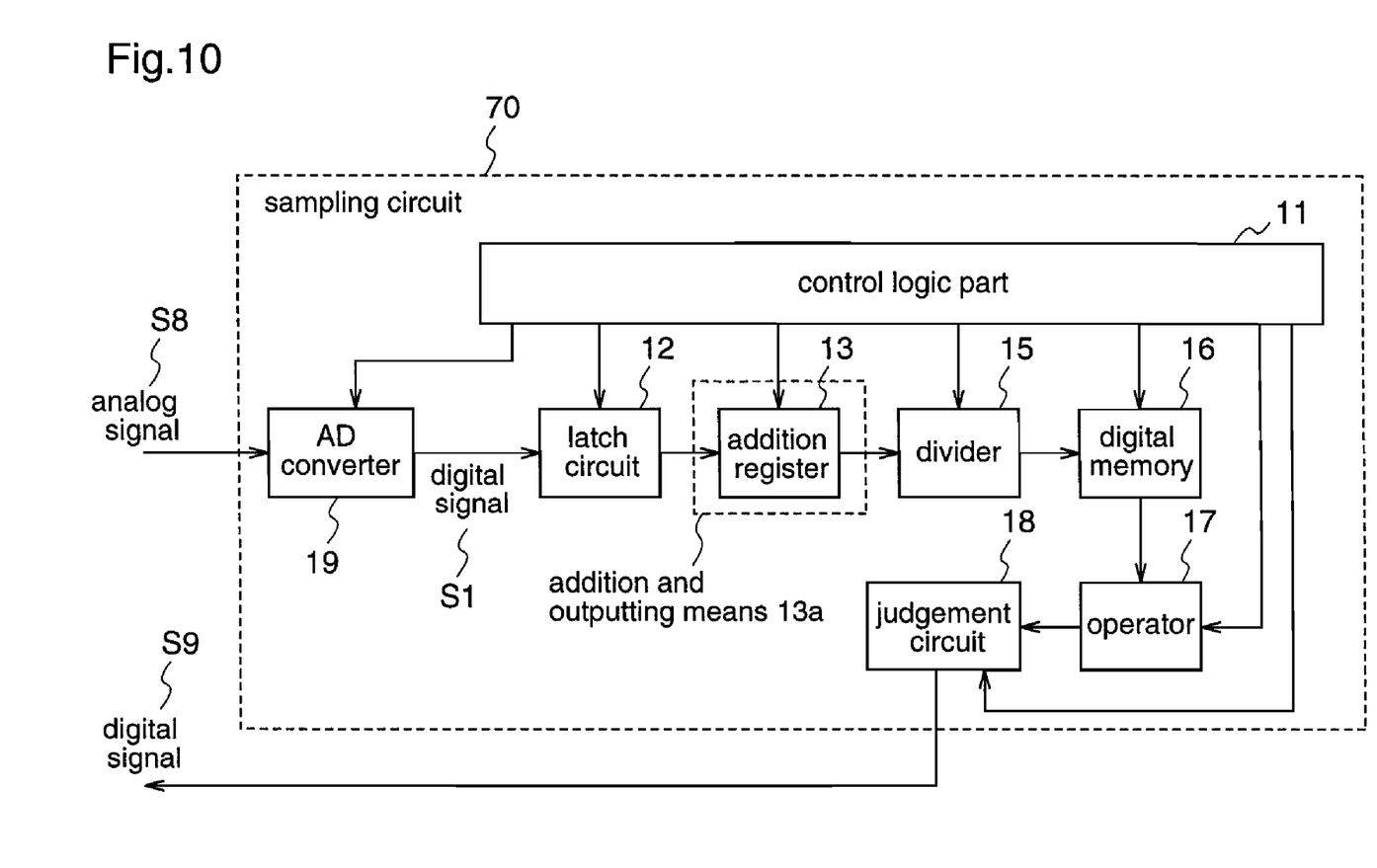
FIG. 10 is a diagram illustrating a construction of a sampling circuit in an AD converter or a DA converter according to a seventh embodiment of the present invention.

FIG. 10 is a diagram illustrating a construction of a sampling circuit 70 according to the seventh embodiment. In FIG. 10, the same reference numerals as used in FIG. 9 are added to the same constituents.

The sampling circuit 70 of this seventh embodiment is provided with a control logic unit 11, a latch circuit 12, an addition and outputting means 13a, a divider 15, a digital memory 16, an operator 17, a judgment circuit 18, and an AD converter (digital conversion means) 19. In addition, the addition and outputting means 13a comprises an addition register 13.

The AD converter 19 makes the analog signal S8 that is inputted to the sampling circuit 10 from the device to be measured subjected to the AD conversion processing, and outputs the digital data S1 to the latch circuit 12.

Herein, the control logic unit 11 controls the AD conversion timings and the dynamic ranges for the AD conversion by the AD converter 19.

In addition, the control logic unit 11 includes an addition number setting means (not shown) for setting an addition number for the digital data which are added together by the addition register 13 for the same input code, a divisor number setting means (not shown) for setting a divisor number that is employed for the division processing by the divider 15 on the basis of the addition numbers which are set by the addition number setting means, and a data output number setting means (not shown) for setting a reading out number for the digital data which are stored in the digital memory 16, and the control logic unit 11 is operated to control timings for storing the divided values which are outputted from the divider 15 into the digital memory 16 and timings for outputting stored divided value from the divided memory 16.

In addition, the control logic unit 11 controls timings for the operations by the operator 17 and timings for outputting the operation result.

Further, the control logic unit 11 controls timings for judgments by the judger circuit 18 and timings for outputting the judgment result.

An operation of the sampling circuit 70 of this seventh embodiment will be described. Herein, the processing from the sampling processing by the latch circuit 12 to the division and outputting processing by the divider 15 are the same as in the third embodiment.

The digital signal for one cycle S8 that is outputted from the device to be measured is inputted to the latch circuit 12. In the AD converter 19, the inputted analog signal S8 is subjected to an AD conversion thereby to output digital signal S1.

The digital signal S1 outputted from AD converter 19 is inputted to the latch circuit 12. In the latch circuit 12, the inputted digital signal S1 is sampled at a constant period.

The sampled digital data is inputted to the addition register 13. In the addition register 13, the digital data sampled by the latch circuit 12 are added together for four data for the same input code, and the added values are outputted.

The added values which are outputted from the addition register 13 are inputted to the divider 15. In the divider 15, the inputted added values are divided by a predetermined division number "4", and the divided values are outputted.

The above-described processing is controlled by the control logic unit 11 such that the sampling processing by the latch circuit 12, the addition and outputting processing by the addition and outputting means 13a, and the division and outputting processing by the divider 15 are carried out concurrently with each other. Specifically, it is controlled such that the addition and outputting processing for four sampled data $a_1$, $a_2$, $a_3$, $a_4$ by the addition register 13 and the division and outputting processing for the added value $X_1$ by the divider 15 are carried out concurrently with the subsequent sampling processing by the latch circuit 12 for four sampled data $a_5$, $a_6$, $a_7$, $a_8$.

The divided value which is outputted from the divider 15 is stored in the digital memory 16, and each of the stored divided values is outputted at each of the predetermined reading out number at arbitrary timings under the control by the control logic unit 11.

The operator 17 receives digital data, which are outputted from the digital memory 16 at each of the predetermined reading out number, performs an operation processing such as a predetermined non-linearity error processing on the received digital data, and outputs the operation result.

The judgment circuit 18 receives the operation result from the operator 17, carries out judgment on the received operation result with a predetermined criterion, and outputs the judgment result. This judgment result serves as output S9 from the sampling circuit 70.

In the sampling circuit of this seventh embodiment, an AD converter 19 that is operated to convert the analog signal for one cycle that is outputted from the device to be measured into a digital signal, a latch circuit 12 which samples the output signal S1 from the AD converter 19 at a constant period, an addition register 13 which adds the sampled digital data together for four data for each same input code and successively outputs the added values, a divider 15 which divides the added value that is outputted from the addition register 13 by a predetermined division number "4" and outputs the divided value, a digital memory 16 which stores the divided value that is outputted from the divider 15 and outputs the divided value stored at each of the predetermined reading out number, an operator 17 which operates the digital data that is outputted from the digital memory 16 according to a predetermined algorism, a judgment circuit 18 which judges the operation result by the operator 17 with a predetermined criterion, and a control logic unit 11 which controls such that the addition and outputting processing by the addition register 13 and the division and outputting processing by the divider 15 are carried out concurrently with the sampling processing by the latch circuit 12 as well as controls timings for storing the digital data into the digital memory 16, timings for outputting the digital data from the digital memory 16, and the data number to be outputted, and further, controls timings for the operation processing by the operator 17 and timings for outputting the operation results, and further, controls timings for judgment operations by the judgment circuit and timings for outputting the judgment result, are provided. Therefore, the processing time from the sampling processing to the division and outputting processing can be reduced, and thereby the inspection time can be reduced to a great extent. In addition, contrary to that in the conventional method, a memory of a large capacity for storing the sampled data up until the addition and outputting processing is performed is required, the sampling circuit of this seventh embodiment does not require mounting such a memory of large data capacity, thereby enabling to reduce the circuit scale to the necessary minimum, and thereby realizing an inspection equipment at a low cost. Further, in this seventh embodiment, since the processing up to the AD conversion, the sampling, taking a mean processing of the sampled data, operation processing, and judgment processing can be carried out, an inspection such as that for non-linearity error in an AD converter can be carried out even by an inspection apparatus that is not provided with a taking a mean means, an operation means, and a judgment means.

While in the seventh embodiment the addition number of sampled data which are added together by the addition register 13 is four for each same input code, the addition number may be individually set for each same input code by the addition number setting means provided in the control logic unit 11, and the divisor number may be individually set for each input data code by the divisor number setting means on the basis of the respective addition numbers which are set by the addition number setting means. Then, it becomes possible to carry out adjustment of the sampling number, and thereby to make the inspection precision and inspection cost of high efficiency.

Further, the sampling circuit in the present invention according to the first to seventh embodiments may be mounted in any of inside the measurement equipment such as a LSI tester, inside the device to be measured, or on a measurement equipment such as an inspection board.

APPLICABILITY IN INDUSTRY

The sampling circuit in an AD converter or a DA converter according to the present invention has an effect of offering cost reduction in the inspection equipment or inspection jig as well as offering reduction in inspection time. So, this is quite effective as a method that can reduce the inspection cost for an apparatus which includes installed an AD converter or a DA converter installed therein.

The invention claimed is:

1. A sampling circuit comprising:
a sampling means which receives digital data which is outputted from a device to be measured as an input and samples the digital data at a constant period;
an addition and outputting means for adding digital data which was sampled by the sampling means for a predetermined addition number for each same input code, and successively outputting the added values; and
a control means for controlling such that the addition and outputting processing by the addition and outputting means is carried out concurrently with the sampling processing by the sampling means;
wherein said control means includes an addition number setting means for individually setting an addition number for the digital data which are to be added by the addition and outputting means for each same input code.

2. A sampling circuit as defined in claim 1, further comprising:
data storing means for storing the added value which is outputted from the addition and outputting means and outputting the added value at arbitrary timings for a predetermined reading out number,
wherein:
said control means includes an output data number setting means for setting the reading out number for the added value which is stored in the data storing means, and
said control means controls timings for storing the added values in the data storing means and timings for reading out the added values from the data storing means.

3. A sampling circuit as defined in claim 2, further comprising an operating means which operates the added values which are read out from the data storing means for each of the predetermined reading out number in accordance with an arbitrary algorithm and outputs the operation result,
wherein the control means controls timings for the operations by the operation means and timings for outputting the operation result.

4. A sampling circuit as defined in claim 3, further comprising a judging means for judging the operation result that is outputted from the operation means with a predetermined criterion and outputting the judgment result,
wherein the control means controls timings for performing judgment by the judging means and timings for outputting the judgment result.

5. A sampling circuit as defined in claim 1, wherein
said addition and outputting means comprises a single adder or plural adders each of which adds the input data for a predetermined addition number and outputs the added value,
said control means includes an addition number setting means for setting an addition number for the input data which are added by the single adder or each of the plural adders, and
said control means controls such that the addition and outputting processing by the single adder or each of the plural adders is carried out concurrently with the sampling processing by the sampling means.

6. A sampling circuit as defined in claim 1, further comprising a digital conversion means for converting analog data that is outputted from the device to be measured into digital data and outputting the converted result to said sampling means,
wherein the control means controls timings and dynamic ranges for the conversion by the digital conversion means.

7. A sampling circuit comprising:
a sampling means which receives a digital data of one cycle that is outputted from a device to be measured and samples the digital data with a constant period;
an addition and outputting means for adding digital data which are sampled by the sampling means for a predetermined addition number for each same input code and successively outputting the added values;

a division and outputting means for dividing each of added values which are outputted from the addition and outputting means by a predetermined divisor and outputting the divided value; and a control means which controls such that the addition and outputting processing by the addition and outputting means and the division and outputting processing by the division and outputting means are carried out concurrently with the sampling processing by the sampling means;

wherein said control means includes;

an addition number setting means for setting the addition number of digital data which is added for the same input code by the addition and outputting means individually for each input code, and a divisor setting means for setting said divisor on the basis of the addition number which is set by the addition number setting means individually for each input data.

8. A sampling circuit as defined in claim 7, further comprising a data storing means which stores the divided value that is outputted from the division and outputting means and outputs the divided value for each of predetermined reading out number at arbitrary timings, wherein the control means has a data output number setting means for setting the reading out number for the divided value which is stored in the data storing means, and the control means controls timings for the divided value entered into the data storing means and timings for the divided value read out from the data storing means.

9. A sampling circuit as defined in claim 8, further comprising an operating means which operates the division value which is read out from the data storing means for each of the predetermined reading out number in accordance with an arbitrary algorithm and outputs the operation result, wherein the control means controls timings for the operations by the operation means and timings for outputting the operation result.

10. A sampling circuit as defined in claim 9 further comprising a judging means for judging the operation result that is outputted from the operation means with a predetermined criterion and outputting judgment result, wherein the control means controls timings for judgments by the judging means and timings for outputting the judgment result.

11. A sampling circuit as defined in claim 7, wherein said addition and outputting means comprises a single adder or plural adders each of which adds the input data for a predetermined addition number and outputs the added result, said control means includes an addition number setting means for setting an addition number for the input data which are added by the single adder or each of the plural adders, and a divisor number setting means for individually setting the divisor for each input data on the basis of the addition number that is set by the addition number setting means, and said control means controls such that the addition and outputting processing by the single adder or each of the plural adders and the division and outputting processing by the division means are carried out concurrently with the sampling processing by the sampling means.

12. A sampling circuit as defined in claim 7 further comprising a digital conversion means which converts analog data that is outputted from the device to be measured into digital data and outputs the result to said sampling means, wherein the control means controls timings and dynamic ranges for the conversion by the digital conversion means.

* * * * *